(12) United States Patent
Bakir et al.

(10) Patent No.: US 7,928,563 B2
(45) Date of Patent: Apr. 19, 2011

(54) 3-D ICS WITH MICROFLUIDIC INTERCONNECTS AND METHODS OF CONSTRUCTING SAME

(75) Inventors: Muhannad S. Bakir, Atlanta, GA (US); Deepak Sekar, Atlanta, GA (US); Bing Dang, Atlanta, GA (US); Calvin King, Jr., Atlanta, GA (US); James D. Meindl, Marietta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 388 days.

(21) Appl. No.: 12/128,542

(22) Filed: May 28, 2008

(65) Prior Publication Data

US 2009/0294954 A1 Dec. 3, 2009

(51) Int. Cl.
 *H01L 23/34* (2006.01)
(52) U.S. Cl. ........ 257/713; 257/686; 257/714; 257/715; 438/109; 438/122
(58) Field of Classification Search .................. 257/686, 257/698, 706, 707, 713, E25.006, E25.013, 257/E25.018, E25.021, E25.027, E23.085, 257/714–716; 438/109, 122, FOR. 413, 438/FOR. 368, FOR. 426
See application file for complete search history.

(56) References Cited

U.S. PATENT DOCUMENTS

| | | | | |
|---|---|---|---|---|
| 6,287,949 B1* | 9/2001 | Mori et al. | ..... | 438/612 |
| 6,710,435 B2* | 3/2004 | Nagaya et al. | ..... | 257/686 |
| 7,266,267 B2 | 9/2007 | Bakir et al. | | |
| 2007/0172987 A1* | 7/2007 | Dugas et al. | ..... | 438/109 |

FOREIGN PATENT DOCUMENTS

| | | |
|---|---|---|
| WO | 88/02979 | 4/1988 |
| WO | 2007/071674 | 6/2007 |

OTHER PUBLICATIONS

Dang, Bing (Ph. D. Thesis); "Integrated Input/Output Interconnection and Packaging for GSI;" Georgia Institute of Technology School of Electrical and Computer Engineering; Apr. 17, 2006; pp. 1-209.
Dang, Bing; Joseph, Paul; Bakir, Muhannad; Spencer, Todd; Kohl, Paul; and Meindl, James; "Wafer-Level Microfluidic Cooling Interconnects for GSI;" 2005 IEEE; pp. 180-182.

(Continued)

*Primary Examiner* — Jasmine J Clark
(74) *Attorney, Agent, or Firm* — Ryan A. Schneider; Troutman Sanders LLP

(57) ABSTRACT

Three dimensional integrated circuits with microfluidic interconnects and methods of constructing same are provided. According to some embodiments, and microfluidic integrated circuit system can comprise a plurality of semiconductor die wafers each having a top and bottom exterior surface. The semiconductor die wafers can form a stack of die wafers. The die wafers can comprise one or more channels formed through the die wafers. The channels can extend generally between top and bottom exterior surfaces of the semiconductor die wafers. A plurality of micro-pipes can be disposed between adjacent semiconductor die wafers in the stack. The micro-pipes can enable the channels to be in fluid communication with each other. A barrier layer can be disposed within at least one of the channels and the micro-pipes. The barrier layer can be adapted to prevent a coolant flowing through the at least one of the channels and the micro-pipes from leeching into the channels and micro-pipes. Other embodiments are also claimed and described.

20 Claims, 6 Drawing Sheets

Use of external tubes for fluidic

OTHER PUBLICATIONS

Dang, Bing; Bakir, Muhannad S.; and Meindl, James D.; "Integrated Thermal-Fluidic I/O Interconnects for an On-Chip Microchannel Heat Sink;" IEEE Electron Device Letters; vol. 27, No. 2; Feb. 2006; pp. 117-119.

Thompson, Terrence E.; "Exploring Options for Keeping the Heat Out;" Aug./Sep. 2006 Chip Scale Review; pp. 42-53.

Toon, John; "Beating the Heat: Liquid Cooling Technique Uses Microfluidic Channels Integrated onto the Backs of Chips;" Jun. 21, 2005; Georgia Tech Research News; pp. 1-4.

Bakir, Muhannad S.; Dang, Bing; and Meindl, James D.; "Revolutionary NanoSilicon Ancillary Technologies for Ultimate-Performance Gigascale Systems;" IEEE 2007 Custom Integrated Circuits Conference (CICC); pp. 421-428.

Topol, A.W., et al.; "Three-dimensional Integrated Circuits;" IBM Journal of Research & Development; vol. 50, No. 4/5, Jul./Sep. 2006; pp. 491-506.

Gurrum, Siva P.; Suman, Shivesh K.; Joshi, Yogendra K.; and Fedorov, Andrei G.; "Thermal Issues in Next-Generation Integrated Circuits;" IEEE Transactions on Device and Materials Reliability; vol. 4, No. 4, Dec. 2004; pp. 709-714.

Thacker, Hiren Dilipkumar (Ph.D. Thesis); "Probe Modules for Wafer-Level Testing of Gigascale Chips with Electrical and Optical I/O Interconnects;" Georgia Institute of Technology School of Electrical and Computer Engineering; May 2006; pp. 1-252.

Koo, Jae-Mo; IM, Sungjun; Jiang, Linan; and Goodson, Kenneth E.; "Integrated Microchannel Cooling for Three-Dimensional Electronic Circuit Architectures;" Journal of Heat Transfer; Jan. 2005, vol. 127; pp. 49-58.

Tukerman, D.B. and Pease, R.F.W.; "High-Performance Heat Sinking for VLSI;" IEEE Electron Device Letters, vol. EDL-2, No. 5, May 1981; pp. 126-129.

Viswanath, Ram; Wakharkar, Vijay; Watwe, Abhay; and Lebonheur, Vassou; "Thermal Performance challenges from Silicon to Systems;" Intel Technology Journal, Q3, 2000; pp. 1-16.

Internet Article from www.bgasockets; Aug.-Sep. 2006; p. 29.

* cited by examiner

Board level fluidic

Use of external tubes for fluidic ated during operation of integrated circuits. According to some embodiments, such devices are configured to operate in a manner to control and/or manage heat dissipation provided from an IC.

3-D ICS WITH MICROFLUIDIC INTERCONNECTS AND METHODS OF CONSTRUCTING SAME

FEDERALLY SPONSORED RESEARCH STATEMENT

The embodiments of the invention described herein were made with partial Government support from DARPA (GIT Project No. 1306M15). The Government may have certain rights to inventions claimed and described in this patent application.

TECHNICAL FIELD

The embodiments of the present invention relate generally to integrated circuits and associated manufacturing methods, and more particularly to, three dimensional integrated circuits and methods of constructing same including microfluidic interconnects for managing thermal energy created during operation of integrated circuits.

BACKGROUND

As transistor technology continues to scale and integration density increases, one performance limiter of an IC chip will be heat management and/or removal. Not only does heat affect device operation but it may also affect end user usage patterns. Because transistors and interconnects reliability and performance depend on operating temperatures, cooling electronics and diminishing device hot spots has never been greater. With the continued scaling of device features and increased power density, chip cooling has become increasingly difficult and costly.

One method of continued scaling includes three-dimensional stacking of chips used to form a stacked integrated circuit package. Three-dimensional (3-D) die (e.g., silicon chip die) stacking increases transistor density and chip functionality by vertically integrating two or more dice. 3-D integration also improves interconnect speed by decreasing interconnect wire length, enables smaller system form factor, and reduces power dissipation and crosstalk.

Motivations for three-dimensional (3D) integration include reduction in system size, interconnect delay, power dissipation, and enabling hyper-integration of chips fabricated using disparate process technologies. Although various low-power commercial products implement improved performance and increased device packing density realized by 3D stacking of chips (e.g., using wire bonds), such technologies are not suitable for high-performance chips due to ineffective power delivery and heat removal. For example, high performance chips are projected to dissipate more than 100 W/cm2 and require more than 100 A of supply current. Consequently, when such chips are stacked, challenges in power delivery and cooling become greatly exacerbated.

Accordingly, there exists a need for three dimensional integrated circuits and methods of constructing same including microfluidic interconnects for managing thermal energy created during operation of integrated circuits. It is to the provision of such three dimensional integrated circuits and fabrication methods that the various embodiments of the present invention are directed.

BRIEF SUMMARY

Various embodiments of the present invention are directed to three dimensional integrated circuits and methods of constructing same including microfluidic interconnects for managing thermal energy created during operation of integrated circuits. According to some embodiments, such devices are configured to operate in a manner to control and/or manage heat dissipation provided from an IC.

In an exemplary embodiment, an integrated circuit package generally comprises a plurality of semiconductor die wafers, a plurality of micro-pipes, and a barrier layer. Each of the die wafers can each have a top and bottom exterior surface. The plurality of semiconductor die wafers can be stacked upon each other to form a stack of die wafers. In addition, each of the semiconductor die wafers can comprise one or more channels formed through the die wafers. Such channels can extend generally between the top and bottom exterior surfaces of the semiconductor die wafers. The micro-pipes can be disposed between adjacent semiconductor die wafers in the stack. And the micro-pipes can enable one or more of the channels to be in fluid communication with each other. The barrier layer can be disposed within at least one of the channels and the micro-pipes. The barrier layer can be prevent a coolant flowing through the at least one of the channels and the micro-pipes from leeching into the at least one of the channels and the micro-pipes.

In another exemplary embodiment, an integrated circuit package can generally comprise a plurality of semiconductor wafers (e.g., semiconductor chips) and a barrier layer. The wafers can each have a top exterior surface and a bottom exterior surface. The plurality of semiconductor wafers can be arranged in a vertical stacked arrangement to form a three dimensional stack of die wafers such that adjacent wafers have facing surfaces. Each of the semiconductor wafers can comprise one or more channels formed through the wafers. A portion of the channels can extend generally between the top and bottom exterior surfaces of the semiconductor wafers. And a portion of the channels can carry conductors for electronically or optically coupling the semiconductor wafers. The barrier layer material can be generally disposed in concert with the semiconductor wafers. The barrier layer is preferably adapted to prevent a coolant flowing proximate the semiconductor wafers from being absorbed by the semiconductor wafers. Thus, the barrier layer can act to contain a flowing coolant to one or more predetermined areas needing cooling (e.g., hot spots).

Embodiments of the present invention can also be implemented as methods. For example, some embodiments can be a method to fabricate a three dimensional integrated circuit package with an integral microfluidic cooling network. Such a method can generally comprise providing a plurality of wafers each comprising an exterior surface in a stack such that at least one exterior surface faces another exterior surface of another wafer. A method can also include providing a plurality of cooling channels in the wafers such that a coolant can be routed at least partially through each of the die wafers. And a method can also include providing at least one of electronic or fluidic couplings intermediate adjacent wafers to interconnect adjacent wafers such that adjacent wafers are in signal communication with each other. Still yet, a method can include providing a barrier layer proximate at least one of the cooling channels such that coolant flowing through the at least one of the channels can not leech through the barrier layer such that absorption of the coolant by the wafers is prevented.

Still yet, embodiment of the present invention can include integrated circuit cooling systems. For example, such a system can be used in a three dimensional integrated circuit package comprising multiple wafers stacked upon each other to form a three dimensional wafer stack. A system to cool and to manage heat dissipated from within the three dimensional circuit package can generally comprise at least two semiconductor wafers, interconnects, heat sink channels, coolant fluidic channels, and a sealant barrier layer. The semiconductor wafers can be stacked upon each other in a vertical arrangement to form a vertical stack of wafers. The interconnects can be electronic or optical interconnects disposed within vias. The vias can be disposed within and defined by the semiconductor wafers. The interconnects can correspond to interconnects in an adjacent semiconductor wafer such that adjacent semiconductor wafers are operatively configured to communicate with each other. The heat sink channels can be formed in at least one surface of each semiconductor wafer. And the heat sink channels can correspond to heat sink channels formed in an adjacent semiconductor wafer. The coolant fluidic channels can be disposed within the plurality of semiconductor wafers. The coolant fluidic channels can be operatively configured to form a coolant loop through the three dimensional stack to remove heat emitted from within the vertical stack of wafers. And the sealant barrier layer can be disposed proximate at least one of the coolant fluidic channels to prevent coolant from leeching into the semiconductor wafers.

In still yet other embodiments of the present invention, interconnect structures for cooling a vertical stack of chips in an integrated circuit package are provided. Such interconnect Structures can comprise polymer, metal, or combination thereof and be configured as microscale pipes to connect fluidic networks in different chips in a 3-D IC stack. In addition, through-silicon vias can be employed with internal conductors to connect different chips electrically. Also, microchannel heat sinks can be fabricated on an integrated circuit with active circuitry or separately, and the IC can contain through-silicon electrical vias. Also, fluidic sockets can be fabricated where needed or desired to receive fluidic micropipes for creating a microfluidic cooling network within an integrated circuit. The junction between micropipes and an integrated circuit (e.g., a silicon die wafer) can made as temporary or permanently sealed. Many micropipes (e.g., ranging from two to one million) can be employed within an integrated circuit.

In other fabrication embodiments, the present invention is also directed to bonding and sealing integrated circuits with use of interconnects. For example, such methods can include making mechanical, electrical, and fluidic interconnections and sealing using dielectrics and metals. Solder, copper, gold, Sn-based, Ag-based, and other metals may be used to make connections (or interconnections). Also, polymers, epoxy, underfill, oxide, and other organic/inorganic dielectrics can be used to facilitate fluidic and mechanical connections and sealing (for fluid). Sealing can be done for each layer individually of all stacked chips simultaneously by using a globtop strategy.

In still yet other fabrication embodiments, the present invention is also directed to fabrication of vias. Such fabrication methods can include fabricating electrical TSVs using a mesh-type seed layer. Such methods can also include fabricating electrical and fluidic input/output and depositing a sealant (second material) on micropipes to enable fluidic sealing once assembled. Sealant can be disposed around the full or partial circumference of a pipe or on an end of a pipe. In addition, some fabrication embodiments include providing sockets that are deformable to receive micropipes. Some fabrication embodiments also include fabricating microchannel heat sink and circuitry on different wafers and then bonding them such that they occupy minimal form factor. Also, fabrication methods can include fabricating electrical and fluidic vias in microchannel heat sinks and also sealing fluidic TSVs in a die (e.g., a CMOS die).

Other aspects and features of embodiments of the present invention will become apparent to those of ordinary skill in the art, upon reviewing the following description of specific, exemplary embodiments of the present invention in conjunction with the accompanying figures. In addition, while features of the present invention may be discussed relative to certain embodiments and figures, all embodiments of the present invention can include one or more of the advantageous features discussed herein.

DETAILED DESCRIPTION OF PREFERRED & ALTERNATIVE EMBODIMENTS

Figure 1:
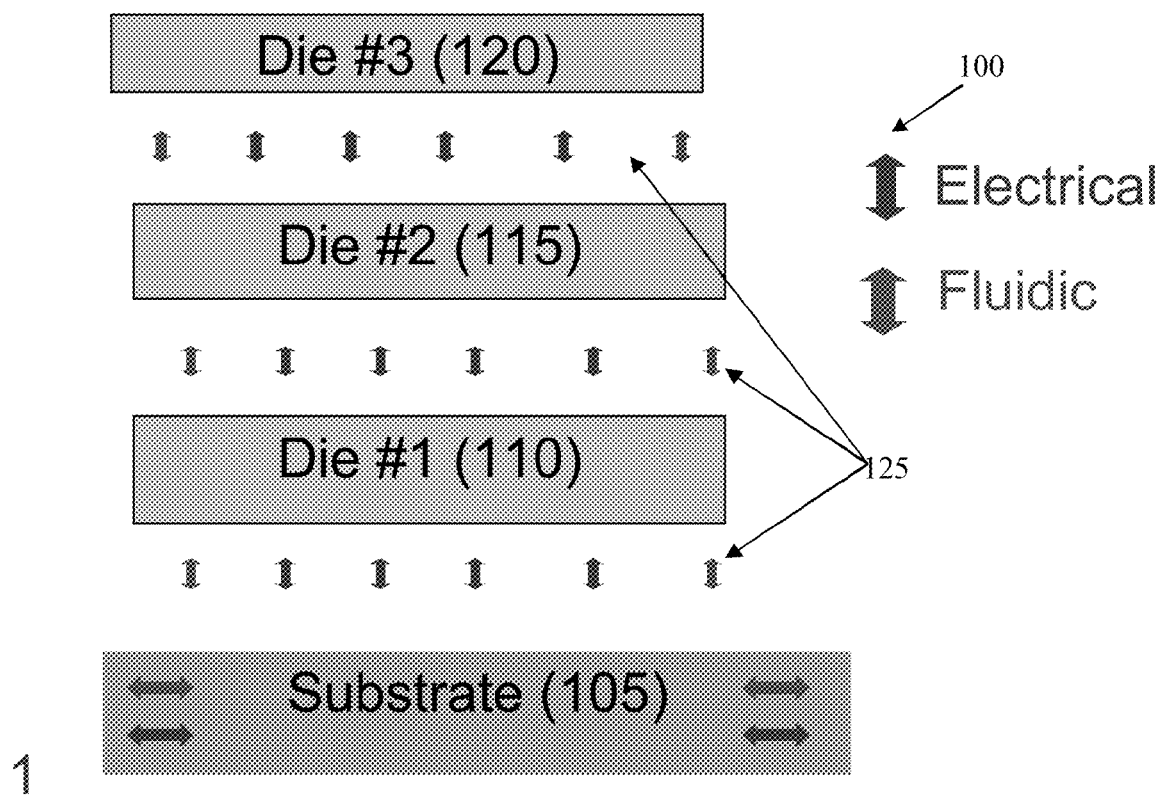
FIG. 1 illustrates a block diagram of an exploded, exemplary 3-D integrated circuit package that includes a microfluidic cooling system in accordance with some embodiments of the present invention.

The International Technology Roadmap for Semiconductors (ITRS) projects that power dissipation will reach 151 W and 198 W for cost performance and high-performance applications, respectively, by 2018 at the 18 nm technology node. Consequently, it is not likely that conventional heat removal techniques will meet the power density, heat flux, and thermal resistance needs of future high performance microprocessors.

Liquid cooling using microchannels, as discussed herein, can meet the thermal management requirements of high-performance microprocessors due to high heat transfer coefficient. Although a number of researchers have explored advantages of using liquid cooling to mitigate future thermal management problems, heretofore many unknowns existed for implementation, especially for 3-D integrated systems. These unknowns include fabrication of an on-chip microfluidic heat sink and integration of electrical through-silicon vias (TSVs), where to place fluidic I/O interconnects for 3D chips, how to supply fluid to and extract fluid from microchannels embedded in a 3D stack, and how to assemble 3D ICs with microfluidic functionality. As mentioned above, embodiments of the present invention enables and provides process integration and assembly technologies for a proposed microfluidic liquid cooling configuration to cool three-dimensional ICs.

Referring now to the figures, wherein like reference numerals represent like parts throughout the several views, exemplary embodiments of the present invention will be described in detail. Throughout this description, various components may be identified as having specific values or parameters, however, these items are provided as exemplary embodiments. Indeed, the exemplary embodiments do not limit the various aspects and concepts of the present invention as many comparable parameters, sizes, ranges, and/or values may be implemented.

FIG. 1 illustrates a block diagram of an exploded, exemplary three dimensional integrated circuit package 100 that includes a microfluidic cooling system 125 in accordance with some embodiments of the present invention. As shown, the IC package generally includes a microchannel heat sink integration into each stratum of a 3D stack. Such an arrangement can enables cooling of about >100 W/cm2. The arrangement can also be used to providing microchannel cooling of up to ~800 W/cm2. In addition, the IC package 100 generally includes a substrate 105 for carrying multiple die wafers 110, 115, 120. The cooling system 125 includes electrical and fluidic connections disposed between adjacent surfaces of the multiple die wafers 110, 115, 120.

In the embodiments disclosed herein, the embodiments generally include a stack of wafers with electrical and fluidic interconnections connecting the wafers in the stack. The electrical interconnections can be of many different conductors and can be implemented as through wafer vias. The fluidic interconnections enable coolant to be routed through a wafer stack. The fluidic interconnections can include pipes (e.g., polymer micro pipes) disposed between wafers and channels formed through the wafers. The pipes can be aligned with the channels in coaxial arrangement to ensure fluid flow therethrough. In some embodiments, a barrier layer can be disposed or provided within the interior surfaces of the pipes and channels. Use of such a barrier layer may be desired to prevent coolant from being absorbed by the pipes and channels.

Coolant can be provided from one or more external sources in accordance with embodiments of the present invention. As coolant is provided to the IC package 100, it is routed through the IC package by virtue of channels and pipes. Coolant flowing through the channels and pipes absorbs heat from the IC package 100 and due to this heat exchange system, coolant can control and/or manage heat dissipated by the IC package 100. It should be understood that embodiments of the present invention can also include embodiments where a cooling network of channels and pipes can be disposed within an IC package. Such a cooling network can include horizontal, diagonal, vertical, or a combination thereof of coolant channels to route coolant through an IC package. The channels can be routed through or on substrates and/or wafers of an IC package.

As illustrated, the IC package 100 includes multiple electrical and fluidic connections between wafers. The fluidic connections are generally disposed on opposing ends of the wafers and provide fluid channels for delivery of a coolant. Such coolant can be any material to absorb heat from the IC package such that heat is moved from the IC package. While illustrated as vertical interconnections, the fluidic channels can be horizontal or diagonal channels for coolant. In addition, the microfluidic channels can enable horizontal coolant flow through a wafer for cooling purposes. As further shown in FIG. 1, coolant can be routed through the IC package's substrate. Such an arrangement provides a coolant inlet and outlet through the substrate.

Utilization of microfluidic channels enables management of heat produced during operation of the IC package 100. Indeed, heat is managed and redirected from the 3D IC package 100 by integrating microchannel heat sinks within each stratum (chip) in the 3D stack. In addition, a liquid coolant is delivered to the microchannel heat sinks within the 3D stack using a thermofluidic interconnect network that is composed of polymeric microfluidic chip I/Os (micropipes) and microfluidic through silicon vias. The thermofluidic interconnect network within the IC package 100 can be integrated with conventional solder bumps and electrical TSVs. Integration in this arrangement enables power delivery and communication between the different chips within the 3D stack of the IC package 100.

Other embodiments and methods are also contemplated in accordance with the present invention. For example, other methods of electrical bonding are compatible with the micropipes (for example, compliant leads, Cu—Cu bonding, etc). Unlike prior work on microfluidic cooling of ICs that require millimeter-sized and bulky fluidic inlets/outlets to the microchannel heat sink, micropipe I/Os according to embodiments of the present invention are microscale, wafer-level batch fabricated, area-array distributed, flip-chip compatible, and mechanically compliant. Electrical TSVs can be, for example fabricated with an aspect ratio of 8:1; other greater ratios (e.g., 49:1) are also possible in accordance with embodiments of the present invention. An exemplary process used to fabricate the microchannel heat sink, electrical and microfluidic TSVs, and the solder bumps (e.g., C4 bumps) and microfludic I/Os is explained below. Temperatures used during fabrication can be maintained below 260 Celsius. Fabrication of the 3D thermofluidic interconnect network 100, which only requires four minimally demanding masking steps, is compatible with CMOS process technology and flip-chip assembly.

Figure 2:
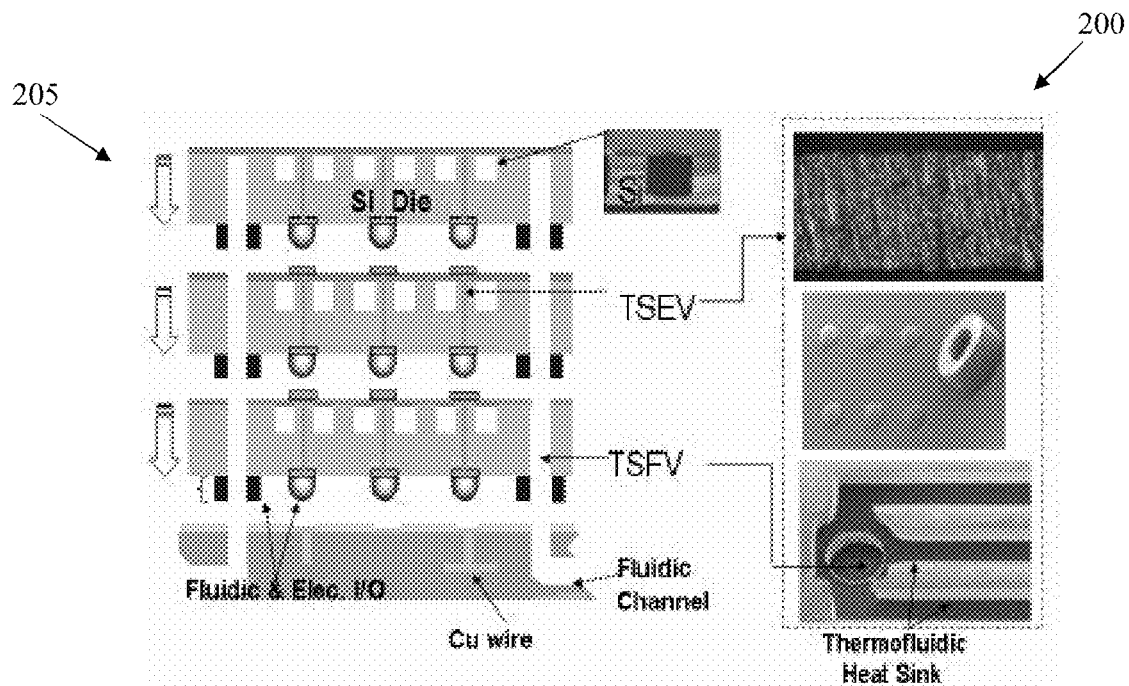
FIG. 2 illustrates a block diagram of an exploded, exemplary 3-D integrated circuit package that includes a microfluidic cooling system with micropipe interconnects and heat sinks in accordance with some embodiments of the present invention.

FIG. 2 illustrates a block diagram of an exploded, exemplary three dimensional integrated circuit package 200 that includes a microfluidic cooling system 205 with micropipe interconnects and heat sinks in accordance with some embodiments of the present invention. As shown, the IC package 200 includes a microfluidic network cooling scheme that can cool three-dimensionally stacked ICs. Each silicon die of the 3D stack contains a monolithically integrated microchannel heat sink; through-silicon electrical (copper) vias (TSEV); through-silicon fluidic (hollow) vias (TSFV) for fluidic routing in the 3D stack; and solder bumps (electrical I/Os) and microscale polymer pipes (fluidic I/Os) on the side of the chip opposite to the microchannel heat sink. Microscale fluidic interconnection between strata is enabled by through-wafer fluidic vias and polymer pipe I/O interconnects. The chips are designed such that when they are stacked, each chip makes electrical and fluidic interconnection to the dice above and below. As a result, power delivery and signaling can be supported by the electrical interconnects (solder bumps and copper TSVs), and heat removal for each stratum can be supported by the fluidic I/Os and microchannel heat sinks.

Figure 3:
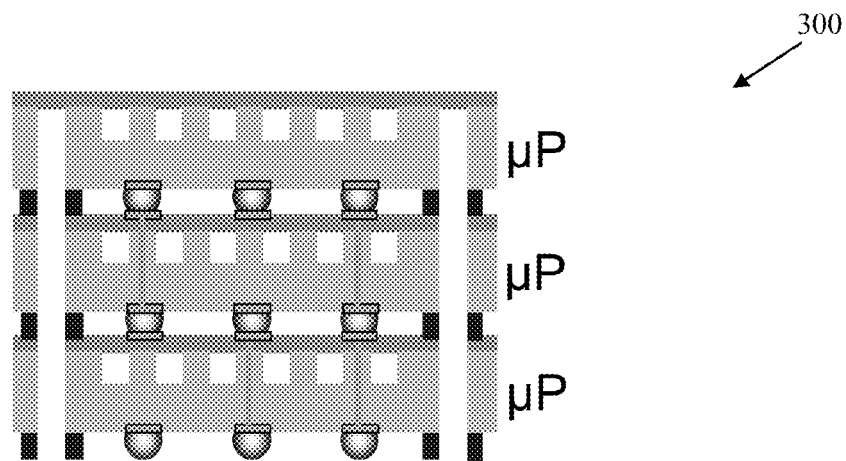
FIG. 3 illustrates a block diagram of an exemplary 3-D integrated circuit package with microfluidic channels in accordance with some embodiments of the present invention.
Figure 4:
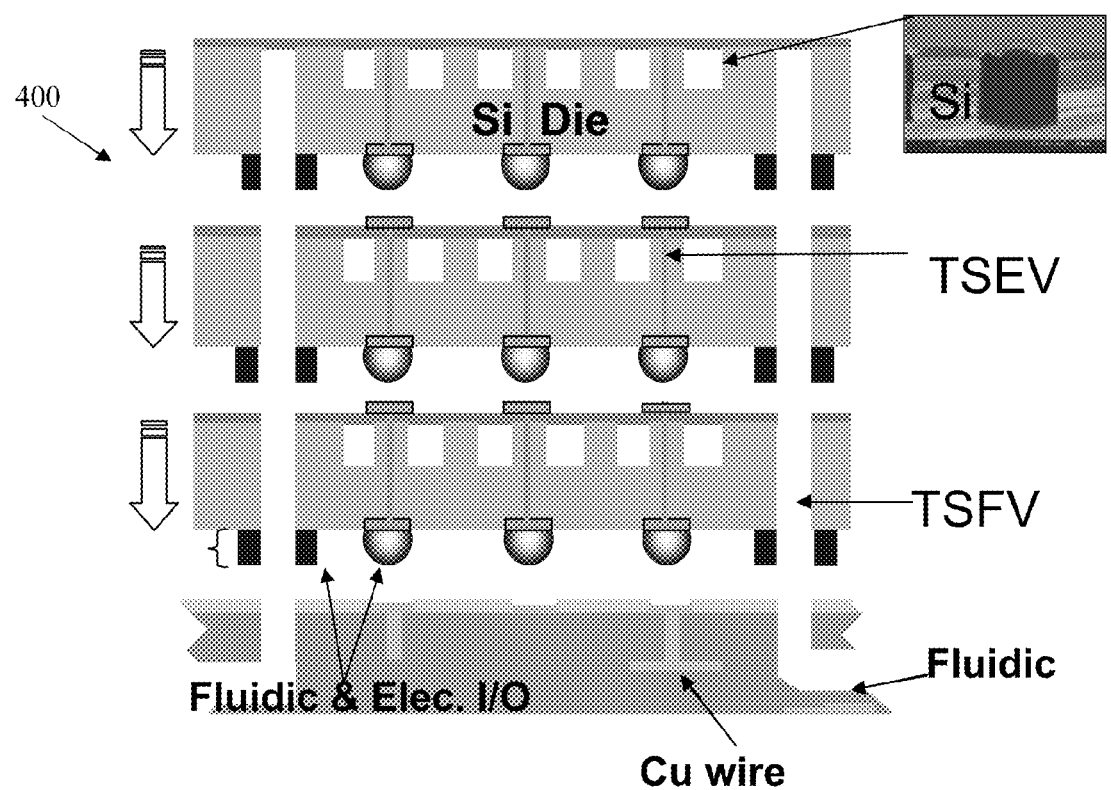
FIG. 4 illustrates a block diagram of another exemplary 3-D integrated circuit package with microfluidic channels in accordance with some embodiments of the present invention.

FIGS. 3 and 4 illustrate a block diagram of an exemplary three dimensional integrated circuit package 300 with microfluidic channels in accordance with some embodiments of the present invention. As shown, the IC package includes micropipes extending between silicon wafers. Such an arrangement enables small form factor and easy fabrication of thermally interconnected wafers in slim fabrication packages. Indeed, as show, fluidic I/Os can be assembled substantially simultaneously with electrical I/Os. Such fabrication arrangement enables thermally isolated layers due to cooling on each layers and multiple fluidic I/Os (inlets/outlets) due to wafer-level batch fabrication.

I/O and assembly technology for microchannel cooled 3D integrated circuits is illustrated in FIGS. 3 and 4, and discussed below. After solder bumping, fluidic pipes are fabricated with a polymer such as Avatrel for the top chip in a two chip 3D stack. The bottom chip in the two chip 3D stack is first assembled onto the substrate with a flip-chip bonder. Following this, the top chip in the 3D stack is assembled onto the bottom chip as shown. Underfill is dispensed to seal fluidic pipes and control co-efficient of thermal expansion mismatches between the chip and the substrate as demonstrated for single chips previously. FIGS. 3 and 4 thus demonstrates chip-level fabrication technology and assembly technology required for a microchannel cooled 3D integrated circuit.

Figure 5:
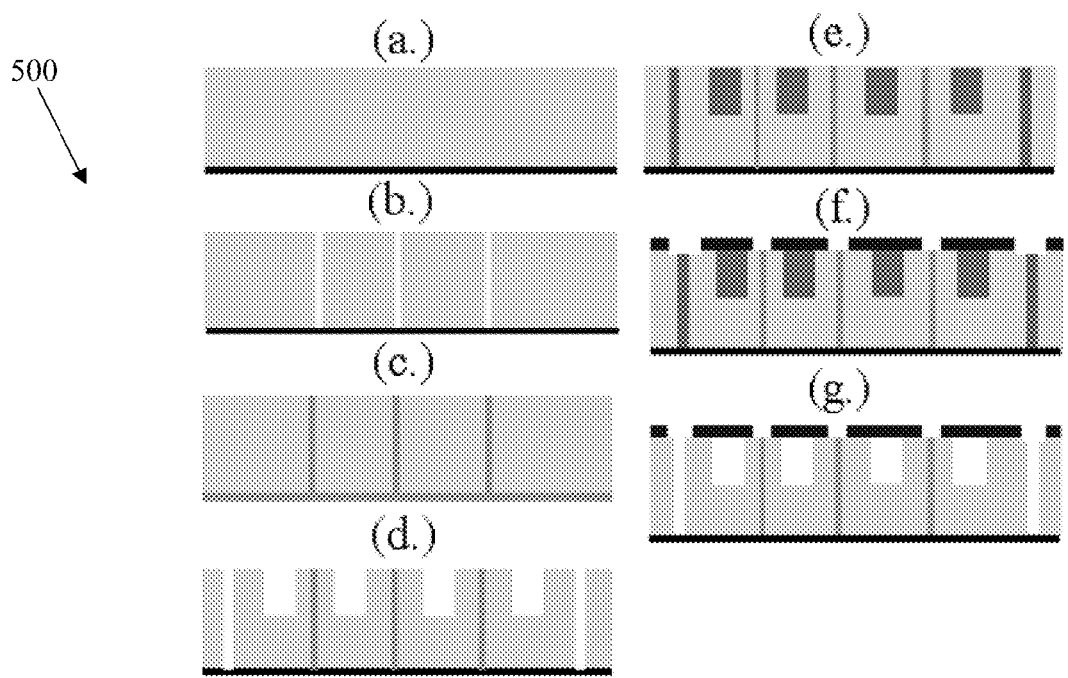
FIG. 5 illustrates a fabrication process to fabricate a 3-D integrated circuit package with microfluidic channels in accordance with some embodiments of the present invention.

FIG. 5 illustrates a fabrication process 500 to fabricate a three dimensional integrated circuit package with microfluidic channels in accordance with some embodiments of the present invention. As shown, a schematic of wafer-level integration of microchannels, through-silicon fluidic vias, and electrical through-silicon vias to enable 3D system integration using liquid cooling is enabled. Indeed, such a fabrication process can include: deposition of oxide on front-side of wafer; patterning and etching through-silicon vias; copper seed layer evaporation and electroplating; fluidic TSVs and microchannel trenches are etched into the back side of the wafer; spin coating and polishing of Unity sacrificial polymer; spin coating and patterning Avatrel polymer sockets; and simultaneous curing of Avatrel polymer and thermally decomposition of sacrificial polymer.

The process can begins by depositing a 3 µm thick layer of silicon-oxide on the front side of the wafer as a through-silicon via etch-stop layer (FIG. 3a). TSVs are patterned and anisotropically etched into the back side of the silicon wafer in an inductive coupled plasma (ICP) etching tool (FIG. 5b). After thermally growing a 1 µm layer of oxide on the TSV sidewalls, a Ti/Cu seed layer is evaporated on the front-side of the wafer. After which, copper is electroplated in the TSVs (FIG. 5c). Next, using two lithography steps, fluidic TSVs and microchannel trenches are etched into the back side of the wafer (FIG. 5d). Subsequently, Unity sacrificial polymer (Promerus, LLC) is spin-coated on the wafer, filling the fluidic TSVs and microchannels. Afterwards, mechanical polishing is performed to planarize the surface (FIG. 5e). Next, 15 µm of Avatrel 2090P polymer (Promerus, LLC) is spin-coated onto the wafer and polymer sockets are patterned (FIG. 5f). Finally, the Avatrel polymer is cured, and the Unity sacrificial polymer is thermally decomposed simultaneously, making the process CMOS-compatible (FIG. 5g). Microchannels can be formed to 200 µm tall and 100 µm wide, and the copper TSVs can have a 50 µm diameter. Platinum resistors can also be fabricated on a wafer to facilitate heating and temperature sensing. The fabrication process 500 illustrated in FIG. 5 can also be modified to yield other fabrication processes to fabricate 3-D IC packages in accordance with the present invention. For example, a fabrication process may include bonding of wafers to provide microfluidic channels. In this fabrication method, microfluidic pipes may not be utilized since channels formed in the wafers can be directly aligned in fluid communication with a need or desire for intermediate interconnects such as micropipes.

Figure 6:
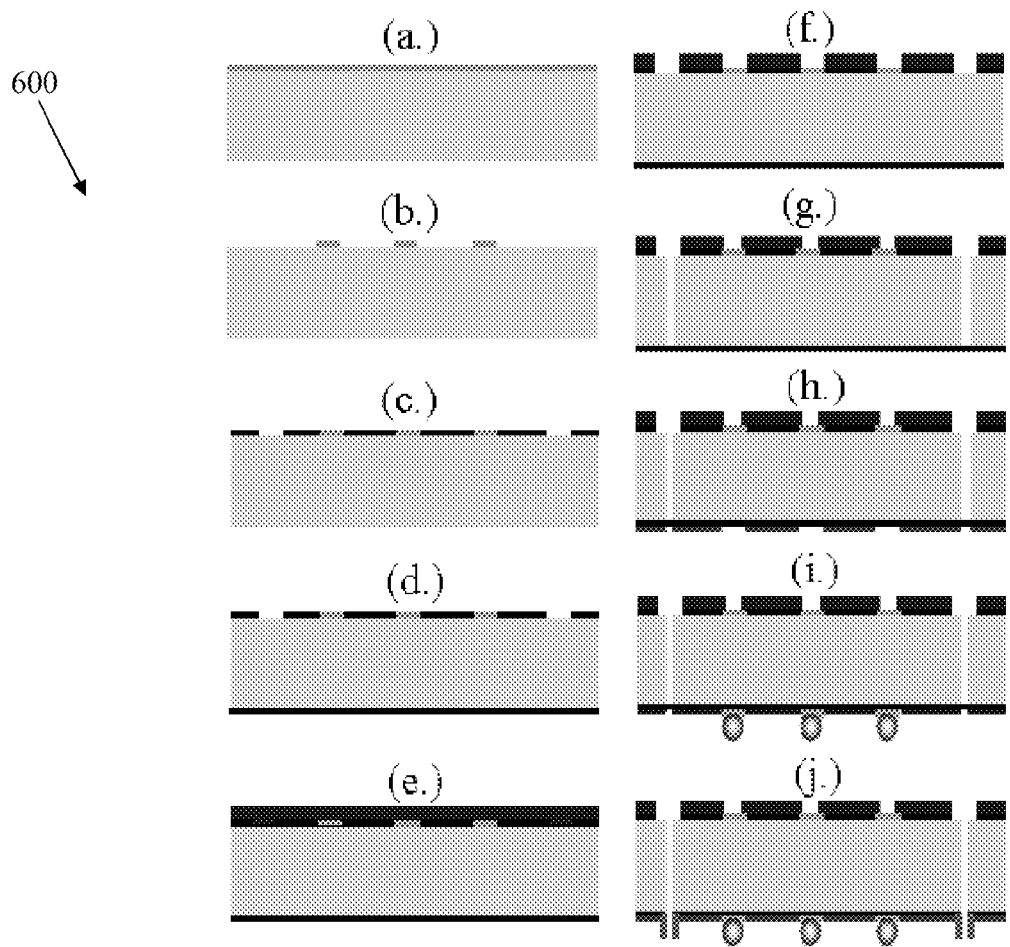
FIG. 6 illustrates another fabrication process to fabricate a 3-D integrated circuit package with microfluidic channels in accordance with some embodiments of the present invention.

FIG. 6 illustrates another fabrication process to fabricate a three dimensional integrated circuit package with microfluidic channels in accordance with some embodiments of the present invention. To address the unknowns of where to place fluidic I/O interconnects for 3D chips, how to supply fluid to each die in the 3D stack, how to assemble 3D ICs with microfluidic functionality and to demonstrate the capability of supplying fluid to each die in the 3D stack, a prototype 3D stack is demonstrated in which chips with electrical and fluidic I/Os are stacked and a coolant is circulated from the top chip, through the 3D stack, and out of the bottom of the substrate. Fabrication, as shown in FIG. 6, is a process flow for a silicon die with integrated polymer sockets, through-wafer fluidic interconnects, thermofluidic I/O interconnects, and electrical I/O interconnects.

The process 600 includes several steps. For example, the process 600 begins by sputtering a 300/10000/300 Å titanium/copper/titanium (Ti/Cu/Ti) metal layer, where Ti serves as an adhesion promoter between Cu and silicon (FIG. 6a). The metal is patterned using a wet etch process (FIG. 6b). Next, 1 µm of oxide is deposited on the back side of the wafer as a polymer adhesion layer (FIG. 6c), and 3 µm of oxide is deposited on the front side as a through-silicon via etch-stop layer (FIG. 6d). Next, 15 µm of Avatrel 2090P polymer is spin coated onto the wafer (FIG. 6e). Afterwards, polymer sockets are patterned on top of the metal (FIG. 6f). The first layer of Ti is removed using a wet-etching process. Through-wafer fluidic vias are patterned and anisotropically etched into the back side of the silicon wafer in an ICP etching tool (FIG. 6g); the etching stops at the etch-stop layer on the front side of the wafer. Next, a 12 µm layer of Avatrel polymer is spin coated and patterned on the front side of the wafer and used as a passivation layer (FIG. 6h). After sputtering a 300/2000/300 Å Ti/Cu/Ti seed layer and electroplating a FIG. 2 µm nickel under-bump metallurgy layer, 50 µm C4 solder bumps are electroplated for area-array electrical interconnects (FIG. 6i). Afterwards, a 60 µm layer of Avatrel polymer is spin coated onto the front side of the wafer and used to pattern polymer pipes, which serve as thermofluidic I/O interconnects (FIG. 6j). Finally, an oxide layer covering the through-wafer fluidic vias on the front side of the wafer is removed using a wet etch process to allow fluidic circulation.

Figure 7:
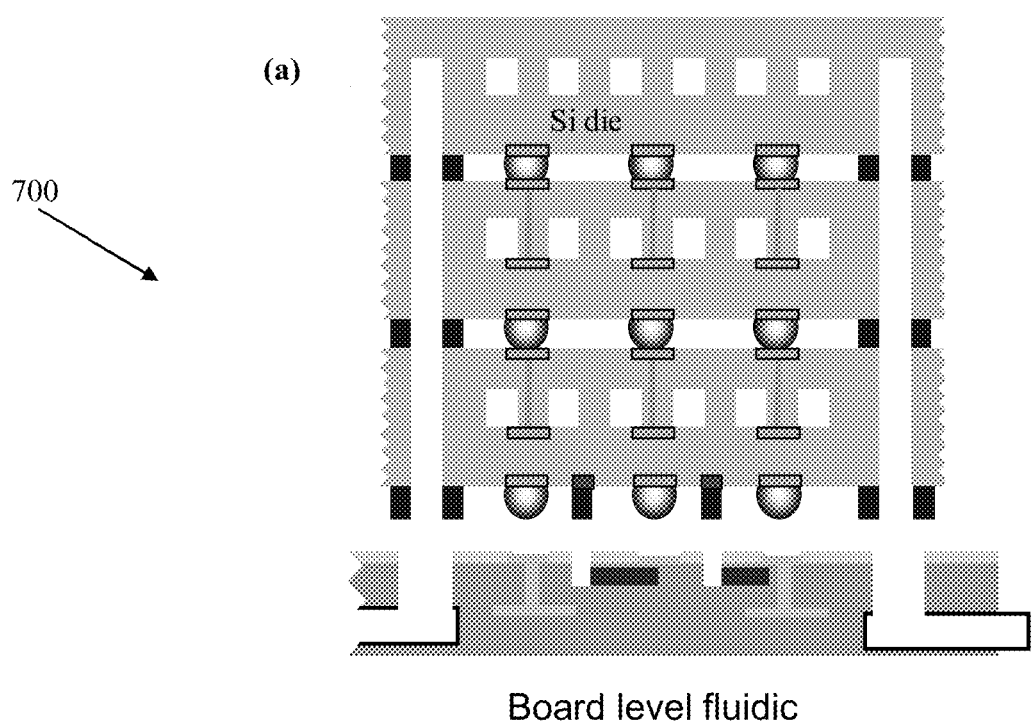
FIG. 7 illustrates a block diagram of an exemplary 3-D integrated circuit package with coolant provided from a circuit board in accordance with some embodiments of the present invention.
Figure 8:
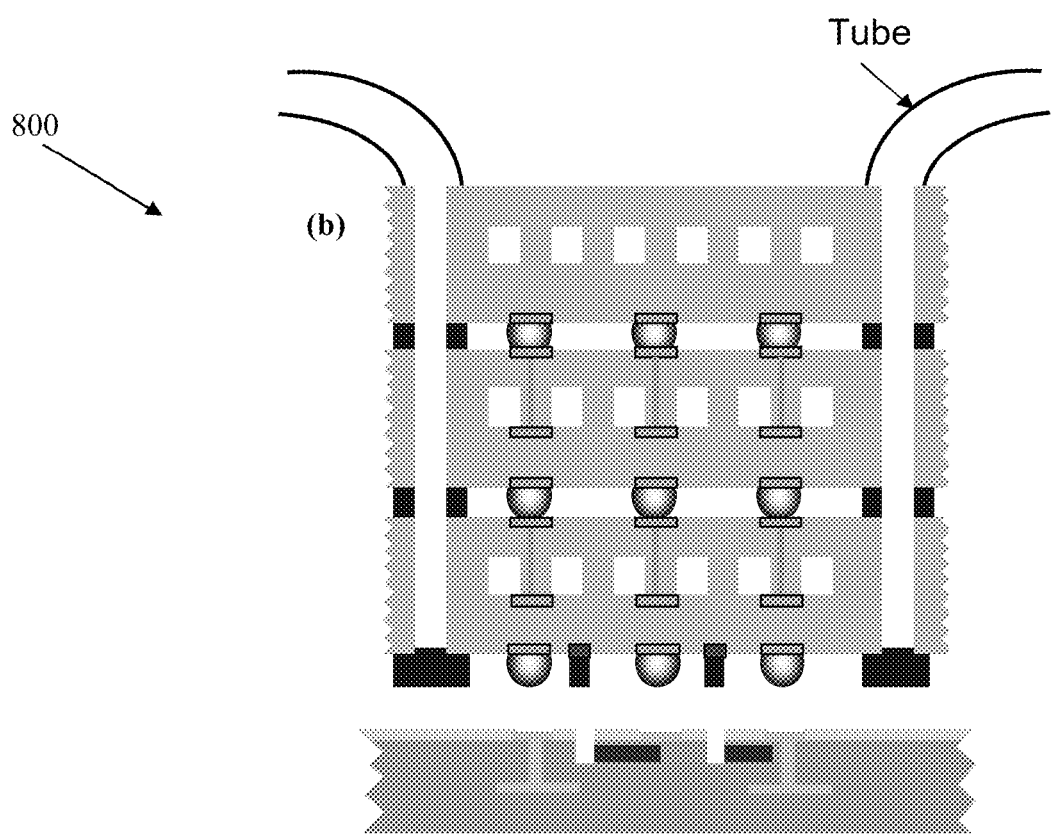
FIG. 8 illustrates a block diagram of another exemplary 3-D integrated circuit package with coolant provided from one or more external supplies in accordance with some embodiments of the present invention.
Figure 9:
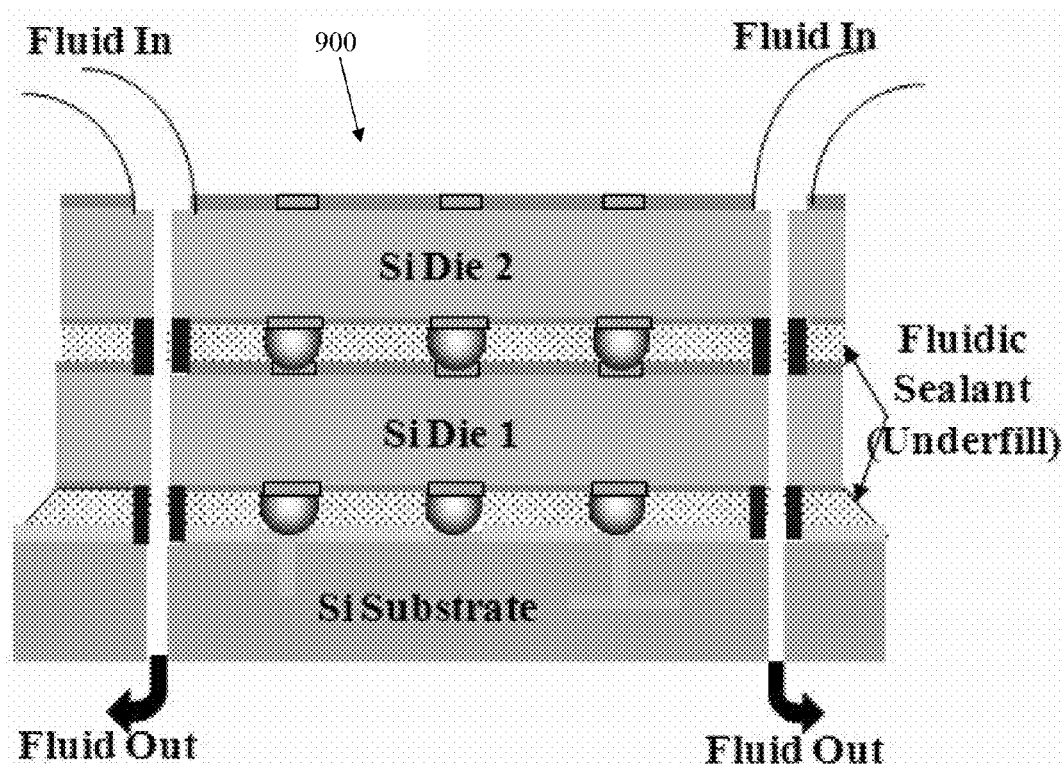
FIG. 9 illustrates a block diagram of another exemplary 3-D integrated circuit package with fluidic seals in accordance with some embodiments of the present invention.

FIGS. 7-10 illustrate block diagrams of other three dimensional integrated circuit package with coolant provided from a circuit board in accordance with some embodiments of the present invention. FIG. 7 illustrates a coolant provided from a printed circuit board carrying multiple silicon wafers and FIG. 8 illustrates how an external coolant supply can provide a coolant fluid in accordance with some embodiments of the present invention. FIG. 9 illustrates additional features of an embodiment wherein fluid coolant is provided from an external source and routed through a passageway exiting from a substrate carrying multiple silicon wafers.

Figure 10:
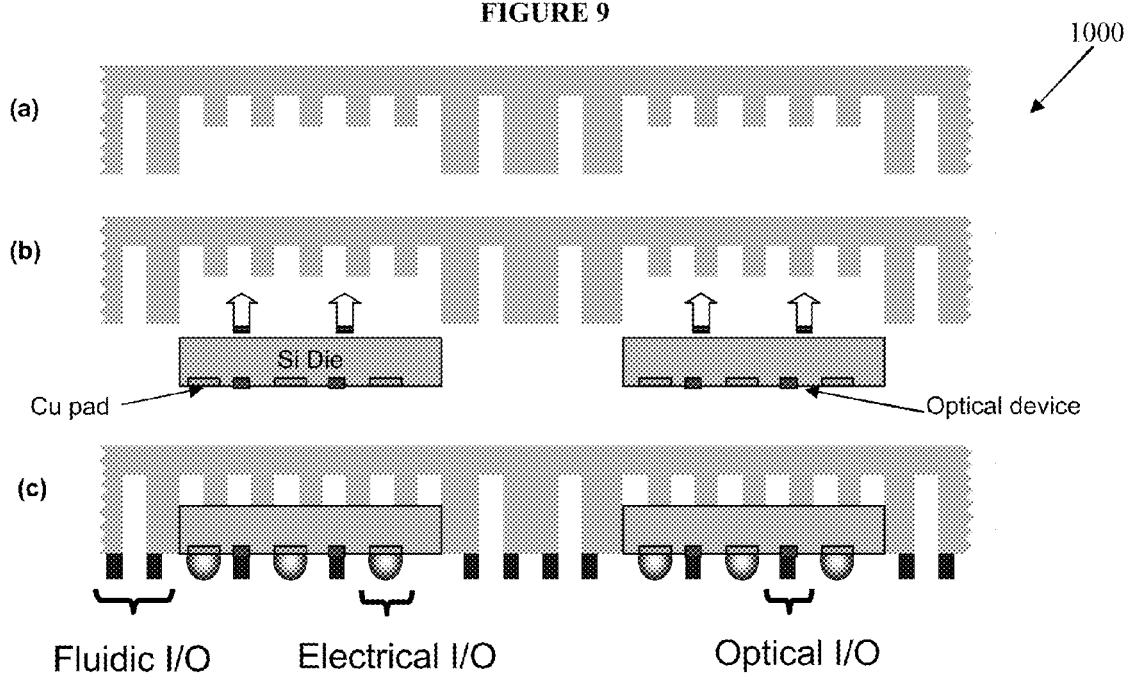
FIG. 10 illustrates a block diagram of another exemplary 3-D integrated circuit package with a carrier microchannel heat sink wafer in accordance with some embodiments of the present invention.

And FIG. 10 illustrates another embodiment of the present invention providing a process for assembling a silicon CMOS dice into a carrier microchannel heat sink wafer. FIG. 10 also illustrates subsequent steps to fabricate electrical, optical, and fluidic I/Os. A key feature of this embodiment enables integration of a microchannel heat sink on a CMOS die without the need for a thermal interface material (TIM) and using low-cost assembly and fabrication processes. For example, there is no need to reconcile the fabrication of the microchannel heat sink with CMOS wafer. In addition, two different wafers can be fabricated in two different foundries.

Figure 11:
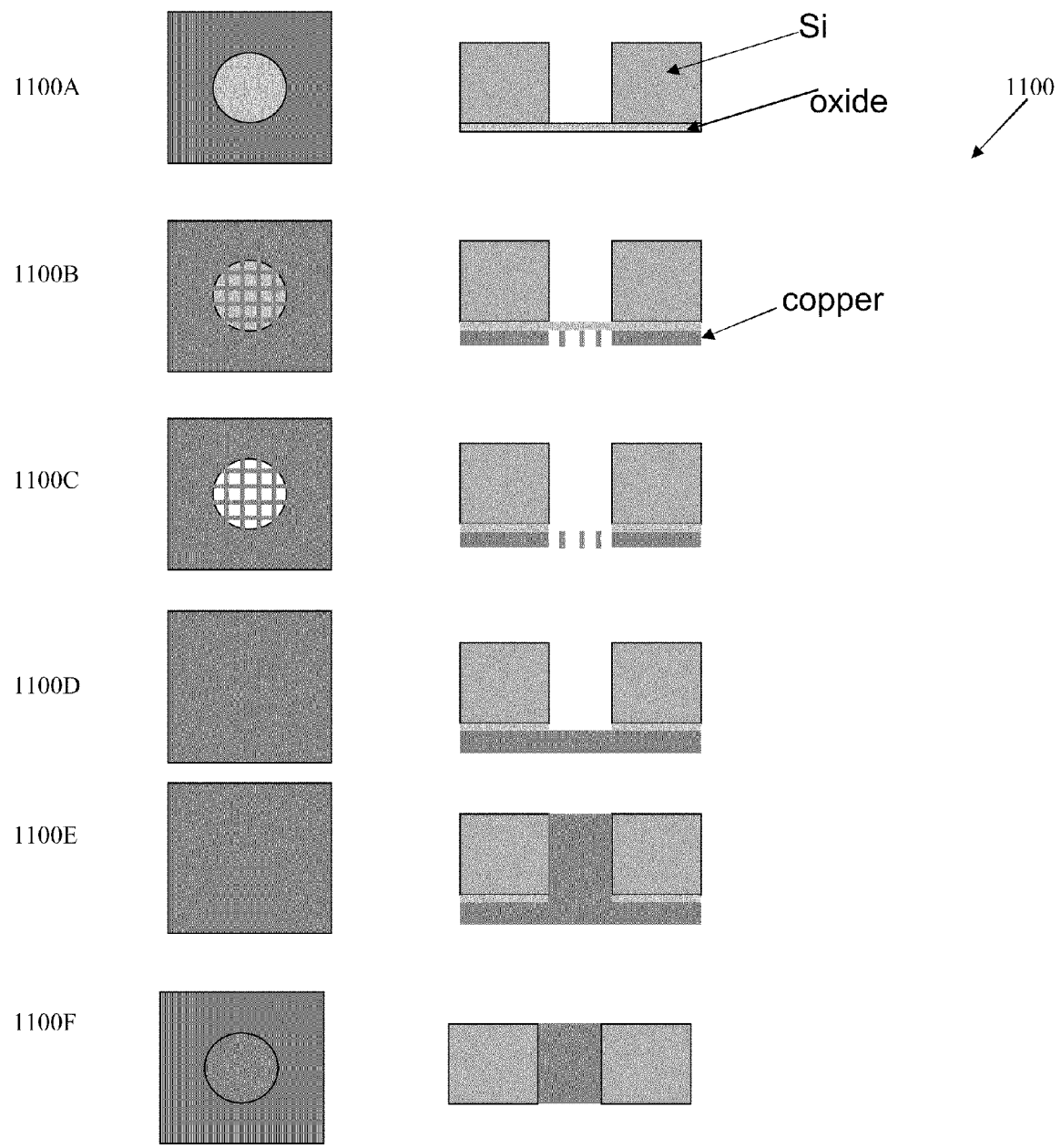
FIG. 11 illustrates a mesh seeding layer process to fabricate through silicon vias for 3-D integrated circuit packages in accordance with some embodiments of the present invention.

FIG. 11 illustrates a mesh seeding layer process 1100 to fabricate through silicon vias for 3-D integrated circuit packages in accordance with some embodiments of the present invention. As shown in FIG. 11, the process 1100 can be used for fabricating electrical through silicon vias (or TSVs). The process 1100 essentially enables filling a through-silicon via with a sacrificial material after etching. Then a seed layer can be deposed over the sacrificial layer (e.g., a seed layer of copper) (1100A). The seed layer can be performed in a mesh arrangement leaving material pillars (e.g., copper pillars placed in gaps) (1100B, 1100C). Removal of the sacrificial layer can the be performed (1100D). Next, material electrodeposition (e.g., copper deposition) can then be used to fill vias created when seeding material (1100E, 1100F) to yield a through silicon via. Advantageously, the process 1100 can greatly reduce the time it takes for horizontal pitch-off used in some fabrication processes.

The embodiments of the present invention are not limited to the particular formulations, process steps, and materials disclosed herein as such formulations, process steps, and materials may vary somewhat. Moreover, the terminology employed herein is used for the purpose of describing exemplary embodiments only and the terminology is not intended to be limiting since the scope of the various embodiments of the present invention will be limited only by the appended claims and equivalents thereof.

Therefore, while embodiments of the invention are described with reference to exemplary embodiments, those skilled in the art will understand that variations and modifications can be effected within the scope of the invention as defined in the appended claims. Accordingly, the scope of the various embodiments of the present invention should not be limited to the above discussed embodiments, and should only be defined by the following claims and all equivalents.

We claim:

1. An integrated circuit package comprising:
    a plurality of semiconductor wafers each having a top exterior surface and a bottom exterior surface, the plurality of semiconductor wafers forming a three dimensional stack of die wafers such that adjacent wafers have facing surfaces;
    each of the semiconductor wafers comprising one or more channels formed through the wafers, wherein a portion of the channels extend generally between the top and bottom exterior surfaces of the semiconductor wafers and wherein a portion of the channels carry conductors for electronically or optically coupling the semiconductor wafers;
    a barrier layer material generally disposed in concert with the semiconductor wafers, the barrier layer adapted to prevent a coolant flowing proximate the semiconductor wafers from being absorbed by the semiconductor wafers.

2. The integrated circuit package of claim 1, further comprising at least one micro-pipe disposed between adjacent semiconductor wafers in the stack, the micro-pipes having opposed ends coupled to adjacent semiconductor wafers, the micro-pipes enabling at least a portion of one or more of the semiconductor wafers to be in fluid communication with each other for cooling.

3. The integrated circuit package of claim 1, wherein at least one of the semiconductor wafers comprises a socket for receiving a micro-pipes, the socket having a diameter less than the diameter of the at least one micro-pipe.

4. The integrated circuit package of claim 1, further comprising a sealant generally disposed at a junction area between a semiconductor die wafer and a micro-pipe to seal the junction area so that a coolant flowing through the junction area remains within the junction area.

5. The integrated circuit package of claim 1, further comprising micro-pipes disposed between adjacent semiconductor wafer surfaces, the micro-pipes being disposed in at least one of horizontal, vertical, or diagonal arrangement between semiconductor die wafers.

6. The integrated circuit package of claim 1, further comprising a microchannel heat sink disposed generally in thermal relationship with one of the die wafers, the heat sink including pre-formed and pre-shaped heat sink channels disposed in at least one of a uniform or non-uniform arrangement.

7. The integrated circuit package of claim 1, further comprising micro-pipes, wherein the micro-pipes are aligned approximately coaxial with corresponding channels formed in the die wafers such that cooling channels are formed within the integrated circuit package.

8. The integrated circuit package of claim 1, further comprising a coolant supply source, the coolant supply source providing a coolant supply from a source exterior to a circuit board coupled to the plurality of semiconductor die wafers or a source disposed generally within a substrate carrying the plurality of semiconductor die wafers.

9. A method to fabricate a three dimensional integrated circuit package with an integral microfluidic cooling network, the method comprising,
    providing a plurality of wafers each comprising an exterior surface in a stack such that at least one exterior surface faces another exterior surface of another wafer;
    providing a plurality of cooling channels in the wafers such that a coolant can be routed at least partially through each of the die wafers;
    providing at least one of electronic or fluidic couplings intermediate adjacent wafers to interconnect adjacent wafers such that adjacent wafers are in signal communication with each other;
    providing a barrier layer proximate at least one of the cooling channels such that coolant flowing through the at least one of the channels can not leech through the barrier layer such that absorption of the coolant by the wafers is prevented.

10. The method of claim 9 further comprising providing and forming a plurality of vias through the wafers, disposing interconnects within the vias, and coupling the electronic or optical couplings to corresponding interconnects disposed within the vias.

11. The method of claim 9 further comprising substantially simultaneously bonding corresponding coolant channels and the electrical or optical couplings when bonding adjacent wafers to each other when forming a three dimensional wafer stack.

12. The method of claim 9, further comprising providing a plurality of micro-pipes between adjacent wafers to interconnect each die wafer, the micro-pipes configured to interact with the cooling channels such that a coolant can move through adjoining die wafers.

13. The method of claim 9, further comprising providing a socket joint in at least one of the wafers to receive a corresponding micro-pipe formed on a corresponding portion of an adjacent wafer and providing a sealant for sealing the corresponding micro-pipe to the adjacent wafer.

14. The method of claim 9, further comprising providing a coolant supply channel in fluid communication with the die wafers to provide coolant to manage thermal energy emitted by the stack.

15. The method of claim 9, further comprising providing micro-pipes and forming the channels and the micro-pipes to have an inner diameter approximately equal to each other.

16. The method of claim 9, further comprising providing one or more heat sink channels in at least of one of the die wafers.

17. In a three dimensional integrated circuit package comprising multiple wafers stacked upon each other to form a three dimensional wafer stack, a system to cool and to manage heat dissipated from within the three dimensional circuit package, the system comprising:

a plurality of semiconductor wafers stacked upon each other in a vertical arrangement to form a vertical stack of wafers;

a plurality of electronic or optical interconnects disposed within vias disposed within the semiconductor wafers, the interconnects corresponding to interconnects in an adjacent semiconductor wafer such that adjacent semiconductor wafers are operatively configured to communicate with each other;

a series of heat sink channels formed in at least one surface of each semiconductor wafer, the heat sink channels corresponding to heat sink channels formed in an adjacent semiconductor wafer;

a plurality of coolant fluidic channels disposed within the plurality of semiconductor wafers forming a coolant loop through the three dimensional stack to remove heat emitted from within the vertical stack of wafers; and a sealant barrier layer disposed proximate at least one of the coolant fluidic channels to prevent the coolant from leeching into the semiconductor wafers.

18. The system of claim 17, further comprising a plurality of micro-pipes disposed generally between semiconductor wafers to transport coolant between adjacent semiconductor wafers, each of the micro-pipes having approximately the same diameter and formed on opposing sides of the semiconductor wafers.

19. The system of claim 17, further comprising one or more sealant junction layers generally disposed between the coolant fluidic channels and semiconductor wafers to prevent coolant leakage between the fluidic channels and semiconductor wafers.

20. The system of claim 17, further comprising on or more coolant supply channels formed integrally and horizontally within the semiconductor wafers to provide coolant within a corresponding semiconductor wafer.

\* \* \* \* \*